United States Patent
Yokoyama et al.

(10) Patent No.: US 10,431,882 B2
(45) Date of Patent: Oct. 1, 2019

(54) ANTENNA MODULE AND CIRCUIT MODULE

(71) Applicant: Murata Manufacturing Co., Ltd., Kyoto (JP)

(72) Inventors: Michiharu Yokoyama, Kyoto (JP); Nobumitsu Amachi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 210 days.

(21) Appl. No.: 15/498,853

(22) Filed: Apr. 27, 2017

(65) Prior Publication Data

US 2017/0229769 A1 Aug. 10, 2017

Related U.S. Application Data

(63) Continuation of application No. PCT/JP2015/079562, filed on Oct. 20, 2015.

(30) Foreign Application Priority Data

Oct. 31, 2014 (JP) .................................. 2014-223400

(51) Int. Cl.
*H01Q 1/38* (2006.01)
*H01Q 1/22* (2006.01)
(Continued)

(52) U.S. Cl.
CPC ............... *H01Q 1/38* (2013.01); *H01L 21/78* (2013.01); *H01L 23/3121* (2013.01);
(Continued)

(58) Field of Classification Search
CPC .. H01Q 1/2283; H01Q 21/065; H01Q 21/067; H01Q 21/22
(Continued)

(56) References Cited

U.S. PATENT DOCUMENTS

2004/0080044 A1* 4/2004 Moriyama ............. H01L 23/10
257/728
2006/0092079 A1* 5/2006 de Rochemont ...... H01Q 1/362
343/700 MS
(Continued)

FOREIGN PATENT DOCUMENTS

JP H06-104461 A 4/1994
JP 2003-188538 A 7/2003
(Continued)

OTHER PUBLICATIONS

International Search Report issued in Application No. PCT/JP2015/079562 dated Nov. 24, 2015.
(Continued)

*Primary Examiner* — Daniel Munoz
(74) *Attorney, Agent, or Firm* — Pearne & Gordon LLP

(57) ABSTRACT

An antenna that is formed of a conductor pattern is disposed on a dielectric substrate. A high-frequency semiconductor device that supplies a high-frequency signal to the antenna is mounted on the bottom surface of the dielectric substrate. A plurality of conductor columns project from the bottom surface. The conductor columns are embedded in a dielectric member that is disposed on the bottom surface. An end of each of the conductor columns is exposed through the dielectric member. The dielectric member defines a mounting surface that faces a mounting substrate. A step is formed in a side surface of a composite structure that includes the dielectric substrate and the dielectric member, and a side surface extending from the mounting surface to the step is more recessed than a side surface that is located above the step.

13 Claims, 8 Drawing Sheets

(51) Int. Cl.
  *H01Q 1/24* (2006.01)
  *H01Q 23/00* (2006.01)
  *H01L 21/78* (2006.01)
  *H01L 23/31* (2006.01)
  *H01L 23/552* (2006.01)
  *H01L 23/66* (2006.01)
  *H01L 23/00* (2006.01)
  *H01Q 1/52* (2006.01)
  *H01Q 21/22* (2006.01)
  *H01Q 21/06* (2006.01)
  *H01Q 25/00* (2006.01)
  *H01L 21/56* (2006.01)
  *H01Q 19/30* (2006.01)

(52) U.S. Cl.
  CPC ........ *H01L 23/3135* (2013.01); *H01L 23/552* (2013.01); *H01L 23/66* (2013.01); *H01L 24/16* (2013.01); *H01Q 1/2283* (2013.01); *H01Q 1/24* (2013.01); *H01Q 1/526* (2013.01); *H01Q 21/065* (2013.01); *H01Q 21/067* (2013.01); *H01Q 21/22* (2013.01); *H01Q 23/00* (2013.01); *H01Q 25/00* (2013.01); *H01L 21/561* (2013.01); *H01L 2223/6616* (2013.01); *H01L 2223/6677* (2013.01); *H01L 2224/16225* (2013.01); *H01L 2224/16265* (2013.01); *H01L 2924/0002* (2013.01); *H01L 2924/181* (2013.01); *H01L 2924/19042* (2013.01); *H01L 2924/19104* (2013.01); *H01Q 19/30* (2013.01)

(58) Field of Classification Search
  USPC .......................................... 257/728
  See application file for complete search history.

(56) References Cited

U.S. PATENT DOCUMENTS

| | | | |
|---|---|---|---|
| 2010/0201580 A1 | 8/2010 | Goldberger | |
| 2012/0212384 A1* | 8/2012 | Kam | H01Q 1/2283 |
| | | | 343/767 |
| 2012/0280860 A1* | 11/2012 | Kamgaing | H01Q 1/2283 |
| | | | 342/368 |

FOREIGN PATENT DOCUMENTS

| | | |
|---|---|---|
| JP | 2006-067375 A | 3/2006 |
| JP | 2007-013456 A | 1/2007 |
| JP | 2012-517759 | 8/2012 |
| JP | 2012-195617 A | 10/2012 |

OTHER PUBLICATIONS

Written Opinion issued in Application No. PCT/JP2015/079562 dated Nov. 24, 2015.

* cited by examiner

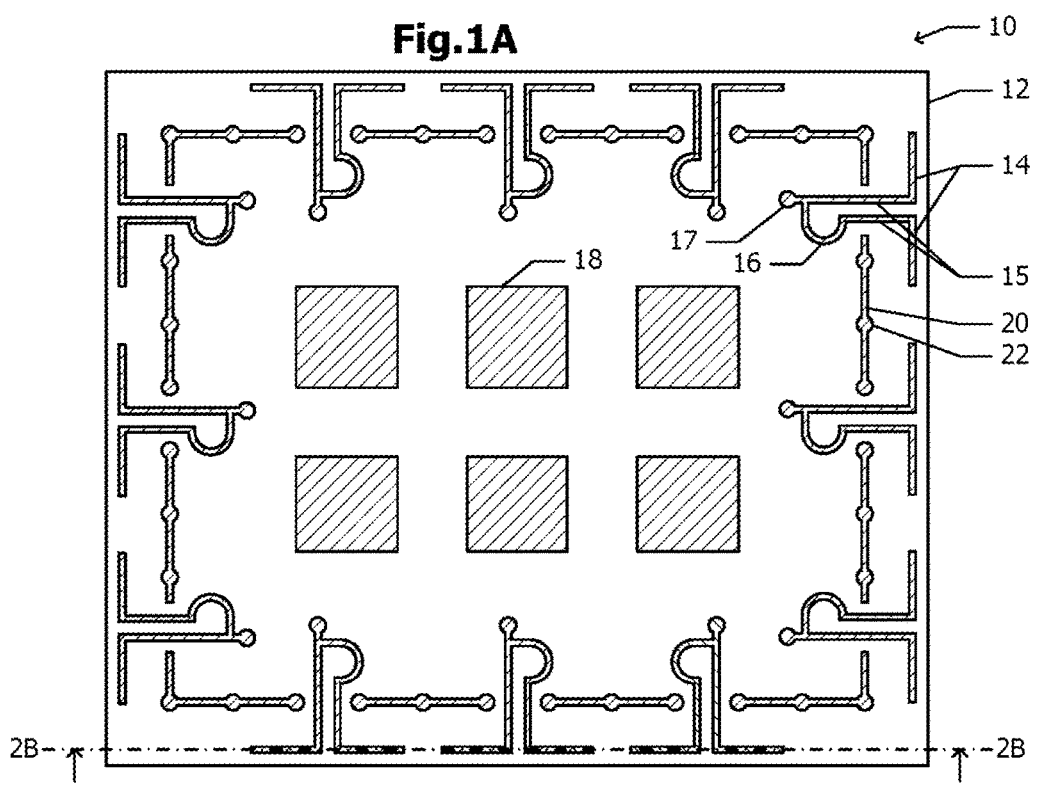
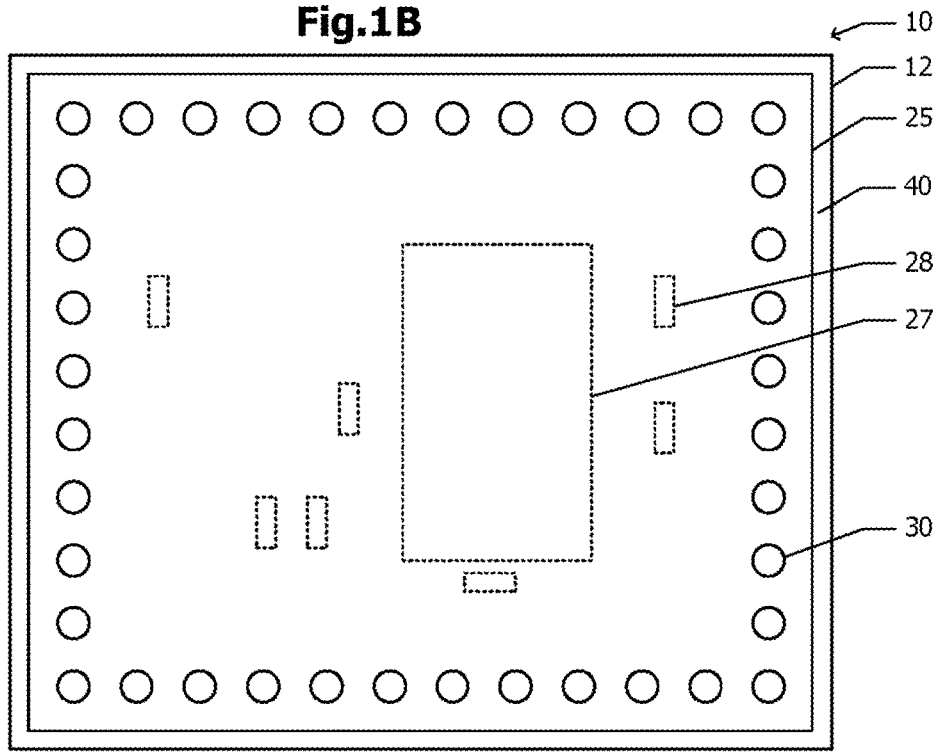

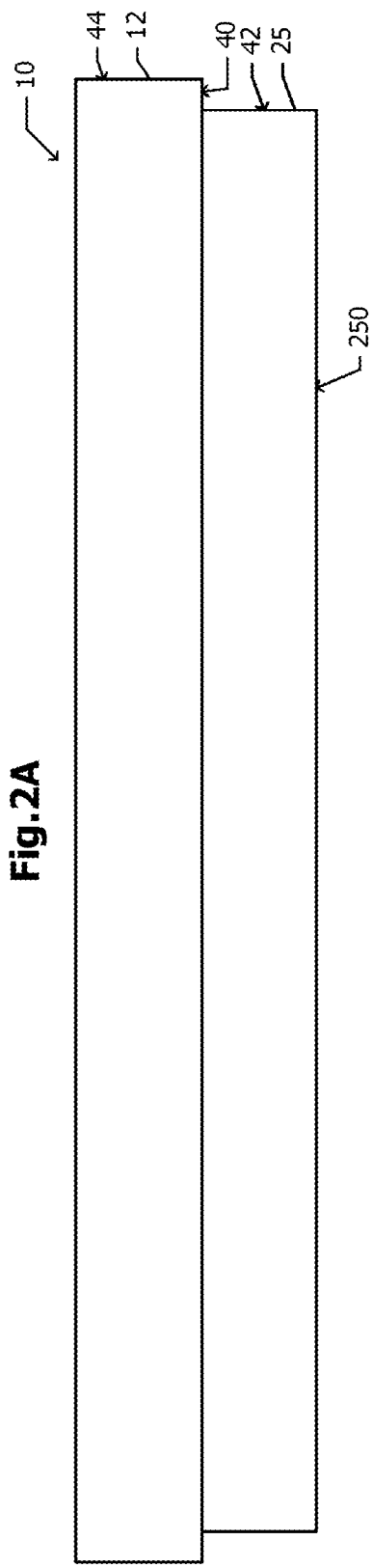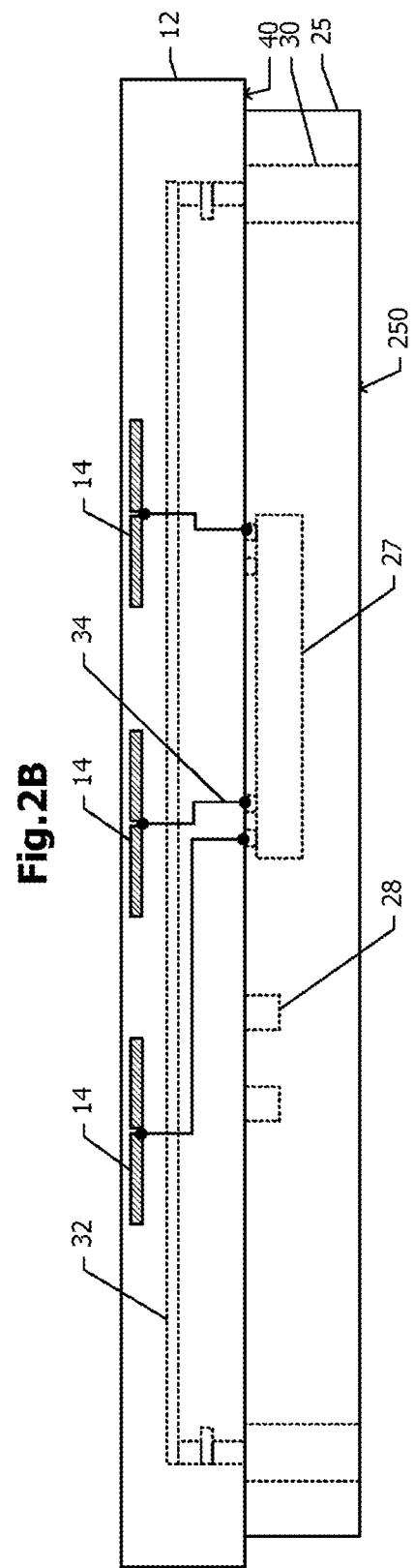

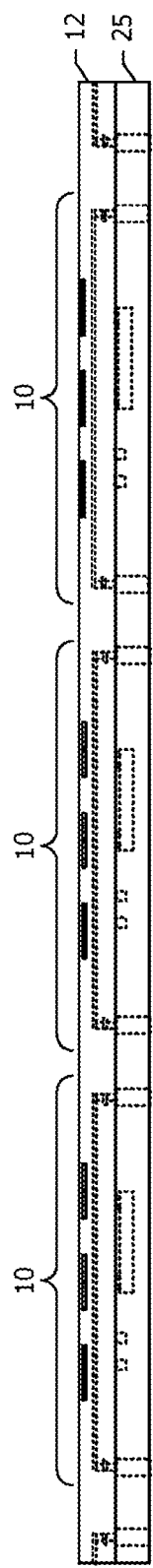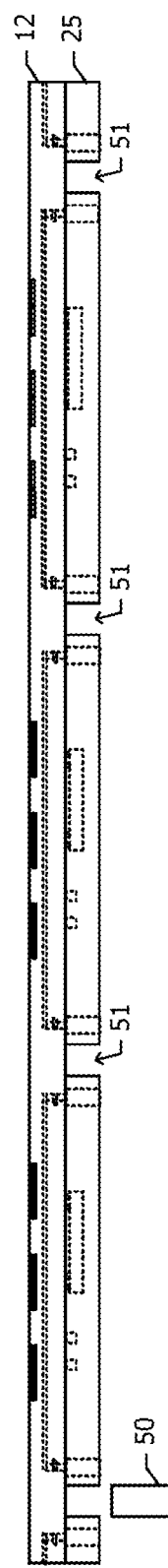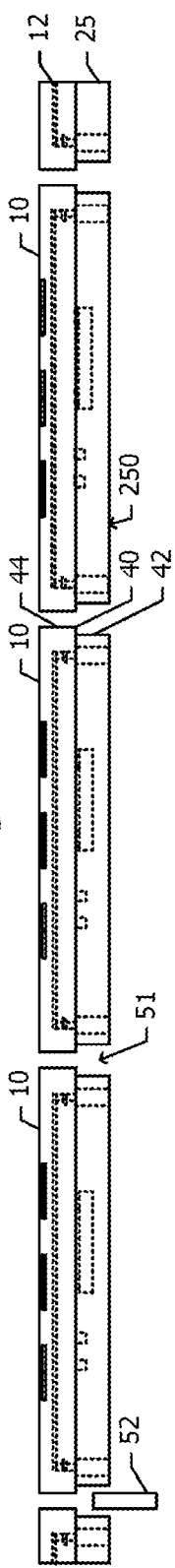

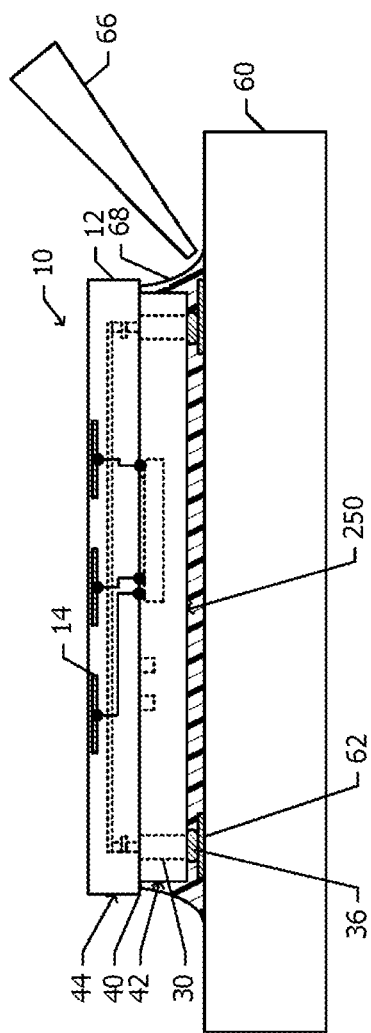

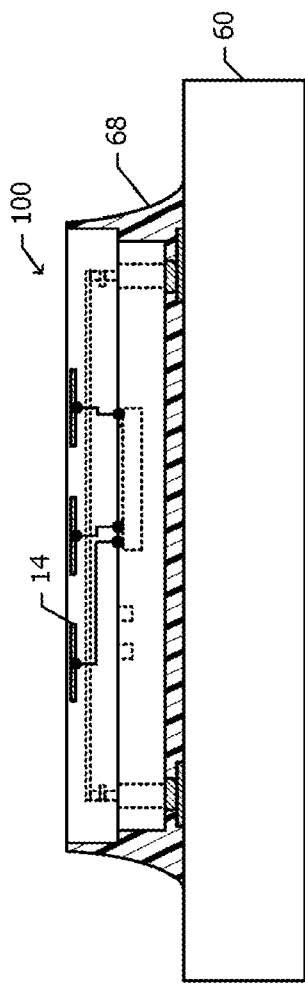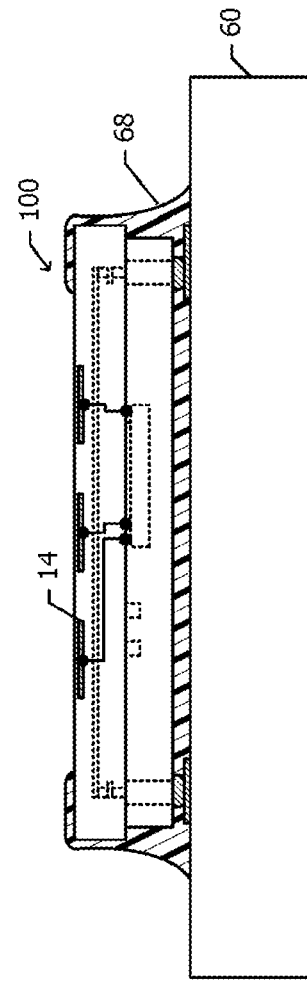

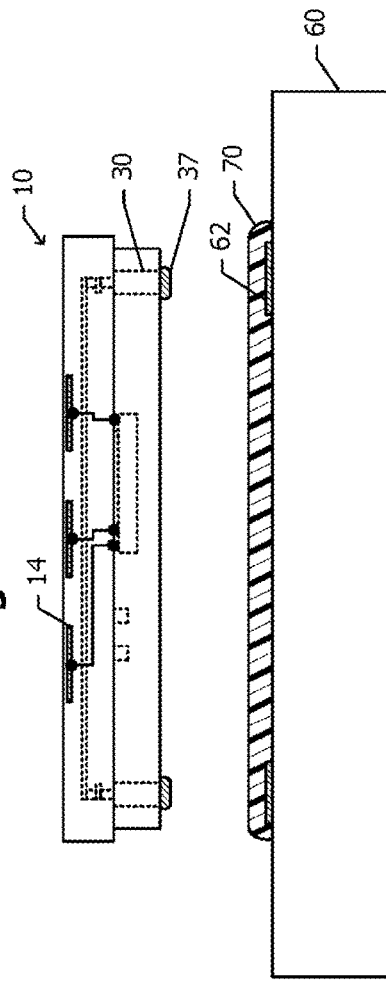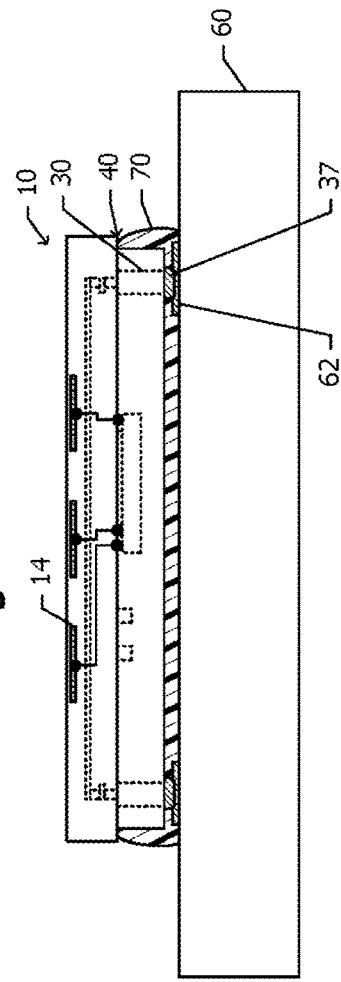

ANTENNA MODULE AND CIRCUIT MODULE

This is a continuation of International Application No. PCT/JP2015/079562 filed on Oct. 20, 2015 which claims priority from Japanese Patent Application No. 2014-223400 filed on Oct. 31, 2014. The contents of these applications are incorporated herein by reference in their entireties.

BACKGROUND

Technical Field

The present disclosure relates to an antenna module and a circuit module that are mounted on a mounting substrate.

Patent Document 1 discloses a multilayer module using a ceramic multilayer substrate. When fabricating a ceramic multilayer substrate, a ceramic green sheet that is cut into, for example, a square shape which is 100 mm long by 100 mm wide is used. Circuit components, such as a chip capacitor and a chip resistor, are mounted on the ceramic multilayer substrate. A surface conductor is formed on one surface of the ceramic multilayer substrate. The multilayer module is mounted on a mounting substrate in a position in which the surface, on which the surface conductor is formed, faces the mounting substrate.

Although not described in Patent Document 1, the ceramic multilayer substrate, on which the chip capacitor and the like are mounted, is divided into a plurality of multilayer modules by cutting the ceramic multilayer substrate by using a dicing machine.

Patent Document 1: Japanese Unexamined Patent Application Publication No. 2003-188538

BRIEF SUMMARY

A multilayer module is mounted on a mounting substrate with solder or the like and then strongly fixed onto the mounting substrate by a binder resin, such as an underfill material. The binder resin is injected into a gap between the multilayer module and the mounting substrate and also adheres to the side surfaces of the multilayer module.

There is a case where an end-fire antenna having directivity in a direction parallel to a substrate surface is mounted on the multilayer module. Studies, experiments, and simulations that were repeatedly conducted by the inventor of the present application have revealed that a binder resin that has adhered to the side surface of a multilayer module affects the radiation characteristic of an end-fire antenna. It is difficult to control the thickness of the binder resin coating the side surface of the multilayer module and the shape and the size of a region coated with the binder resin. Consequently, variations in the radiation characteristic of the end-fire antenna occur.

A case may be assumed in which the binder resin also adheres to a region of the top surface of the multilayer module. When the binder resin adheres to the top surface of the multilayer module, the height from a to-be-mounted surface of the mounting substrate to the top of a mounting component may sometimes exceed an acceptable range. In addition, when the thickness of the multilayer module is reduced, the area of the side surface to which the binder resin adheres is decreased. Thus, the fixing strength of the multilayer module is decreased.

The present disclosure provides an antenna module in which it is unlikely that variations in the radiation characteristic of an antenna will occur even in the state where the antenna module is fixed in place by a binder resin. The present disclosure provides an antenna module and a circuit module in each of which a binder resin is less likely to adhere to the top surface thereof. The present disclosure provides an antenna module and a circuit module in each of which the fixing strength thereof obtained by a binder resin is less likely to decrease even if the thickness thereof is reduced.

An antenna module according to a first aspect of the present disclosure includes a dielectric substrate in or which an antenna, which is formed of a conductor pattern, is disposed, a high-frequency semiconductor device that is mounted on a bottom surface of the dielectric substrate and that supplies a high-frequency signal to the antenna, a plurality of conductor columns that projects from the bottom surface, and a dielectric member that is disposed on the bottom surface and in which the conductor columns are embedded such that an end of each of the conductor columns is exposed through the dielectric member. The dielectric member defines a mounting surface that faces a mounting substrate. A step is formed in a side surface of a composite structure that includes the dielectric substrate and the dielectric member, and a part of the side surface extending from the mounting surface to the step is more recessed than the other part of the side surface that is located above the step.

In the case where the antenna module is mounted on the mounting substrates and fixed in place by a binder resin, upward spreading of the binder resin is stopped by the step. Thus, the height of the binder resin, which spreads upward, can be controlled. As a result, occurrence of variations in the radiation characteristic of the antenna can be suppressed. In addition, the binder resin is less likely to reach the top surface of the antenna module. Since the binder resin is brought into close contact also with the step, a decrease in the adhesion strength of the antenna module with respect to the mounting substrate can be suppressed.

In addition to the configuration of the antenna module according to the first aspect of the present disclosure, in the antenna module according to a second aspect of the present disclosure, the antenna has directivity in a direction parallel to a substrate surface of the dielectric substrate, and the step is disposed so as to be closer to the mounting surface than the antenna is.

The binder resin, which spreads upward, will not reach the height of the antenna. Therefore, the influence of the binder resin on the radiation characteristic of the antenna can be reduced.

In addition to the configurations of the antenna modules according to the first and second aspects of the present disclosure, in the antenna module according to a third aspect of the present disclosure, a surface roughness of the side surface extending from the mounting surface to the step is larger than a surface roughness of the side surface located above the step.

Since the surface roughness of the side surface located above the step is small, it is unlikely that upward spreading of the binder resin on the side surface located above the step will occur. Therefore, even if the binder resin has a thickness larger than the step, the upward spreading of the binder resin on the side surface located above the step can be suppressed.

In addition to the configurations of the antenna modules according to the first to third aspects of the present disclosure, in the antenna module according to a fourth aspect of the present disclosure, the high-frequency semiconductor device is embedded in the dielectric member.

The high-frequency semiconductor device can be strongly fixed to the dielectric substrate. In addition, the heat-dissipation characteristic of the high-frequency semiconductor device can be improved.

A circuit module according to a fifth aspect of the present disclosure includes a dielectric substrate on which a conductor pattern is provided, a first semiconductor device that is mounted on a bottom surface of the dielectric substrate and connected to the conductor pattern, a plurality of conductor columns that projects from the bottom surface, and a dielectric member that is disposed on the bottom surface and in which the conductor columns are embedded such that an end of each of the conductor columns is exposed through the dielectric member. The dielectric member defines a mounting surface that faces a mounting substrate. A step is formed in a side surface of a composite structure that includes the dielectric substrate and the dielectric member, and a portion extending from the mounting surface to the step is more recessed than a portion that is located above the step.

In the case where the circuit module is mounted on the mounting substrate and fixed in place by a binder resin, upward spreading of the binder resin is stopped by the step. Thus, the height of the binder resin, which spreads upward, can be controlled. The binder resin is less likely to reach the top surface of the circuit module. Since the binder resin is brought into close contact also with the step, a decrease in the adhesion strength of the circuit module with respect to the mounting substrate can be suppressed.

In addition to the configuration of the circuit module according to the fifth aspect of the present disclosure, in the circuit module according to a sixth aspect of the present disclosure, a side surface extending from the mounting surface to the step has a roughness larger than a roughness of a side surface that is located above the step.

Since the surface roughness of the side surface located above the step is small, it is unlikely that upward spreading of the binder resin on the side surface located above the step will occur. Therefore, even if the binder resin has a thickness larger than the step, the upward spreading of the binder resin on the side surface located above the step can be suppressed.

In addition to the configuration of the circuit module according to the fifth or sixth aspect of the present disclosure, the circuit module according to a seventh aspect of the present disclosure includes a second semiconductor device that is mounted on a top surface of the dielectric substrate, a sealing-resin layer that coats the top surface and in which the second semiconductor device is embedded, the sealing-resin layer having a side surface, which is more recessed than a side surface of the dielectric substrate, and a shield layer that coats the sealing-resin layer and that is connected to a ground layer, which is provided on the dielectric substrate, at a position further outside than the side surface of the sealing-resin layer is.

The second semiconductor device can be shielded by the shield layer.

In the case where an antenna module is mounted on a mounting substrate and fixed in place by a binder resin, upward spreading of the binder resin is stopped by a step. Thus, the height of the binder resin, which spreads upward, can be controlled. As a result, occurrence of variations in the radiation characteristic of an antenna can be suppressed. In addition, the binder resin is less likely to reach the top surface of the antenna module. Since the binder resin is brought into close contact also with the step, a decrease in the adhesion strength of the antenna module with respect to the mounting substrate can be suppressed.

BRIEF DESCRIPTION OF THE SEVERAL VIEWS OF THE DRAWINGS

FIG. 1A is a plan sectional view of the uppermost semiconductor layer of a dielectric substrate that is used in an antenna module according to a first embodiment of the present disclosure, and FIG. 1B is a bottom view of the antenna module.

FIG. 2A is a side view of the antenna module according to the first embodiment, and FIG. 2B is a cross-sectional view taken along one-dot chain line 2B-2B of FIG. 1A.

FIG. 3A to FIG. 3C are respectively a cross-sectional view of the dielectric substrate and a sealing-resin layer before a dicing process is performed, a cross-sectional view of the dielectric substrate and the sealing-resin layer in the middle of the dicing process, and a cross-sectional view of the dielectric substrate and the sealing-resin layer after the dicing process has been performed.

FIG. 4 is a cross-sectional view of the antenna module according to the first embodiment and a mounting substrate.

FIG. 5A and FIG. 5B are cross-sectional views of an antenna module according to a comparative example and a mounting substrate.

FIG. 6A is a cross-sectional view of an antenna module according to a second embodiment that has not been mounted on a mounting substrate and the mounting substrate, and FIG. 6B is a cross-sectional view of the antenna module that has been mounted on the mounting substrate and the mounting substrate.

DETAILED DESCRIPTION

First Embodiment

Figure 7A:
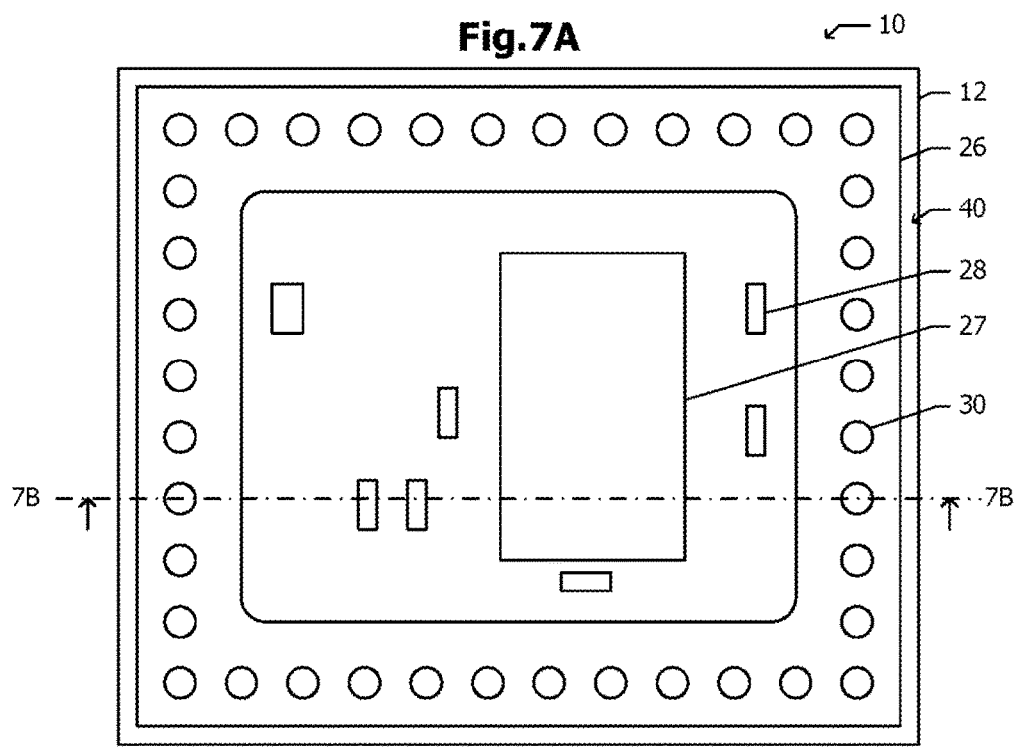
FIG. 7A is a bottom view of an antenna module according to a third embodiment.

An antenna module according to a first embodiment of the present disclosure will now be described with reference to FIG. 1A to FIG. 4A.

FIG. 1A is a plan sectional view of the uppermost semiconductor layer of a dielectric substrate 12 that is used in an antenna module 10. The dielectric substrate 12 has a rectangular or square planar shape. The uppermost semiconductor layer includes a plurality of printed dipole antennas 14, feeders 15, baluns (balanced-to-unbalanced transformers) 16, and a plurality of patch antennas 18. The dielectric substrate 12 is made of, for example, a ceramic, an epoxy resin, or the like. The dipole antennas 14, the feeders 15, the baluns 16, and the patch antennas 18 are each made of, for example, a conductive material such as copper. Similarly, a lower semiconductor layer is also made of a conductive material such as copper.

The plurality of dipole antennas 14 are arranged along the outer peripheral line of the dielectric substrate 12 so as to be positioned slightly further inside than the outer peripheral line. Each of the dipole antennas 14 is disposed so as to be parallel to the outer peripheral line of the dielectric substrate 12. As an example, three of the dipole antennas 14 are arranged so as to correspond to one of the sides of the dielectric substrate 12.

Each of the balanced feeders 15 extends from a corresponding one of the dipole antennas 14 toward the inside of the dielectric substrate 12. The baluns (balanced-to-unbalanced transformers) 16 are disposed at inner end portions of the corresponding feeders 15. Each of the baluns 16 causes the phase of one of the corresponding balanced feeders 15 and the phase of the other of the corresponding balanced feeders 15 to be different from each other by 180 degrees. The baluns 16 are connected to, at connection points 17, transmission lines of an inner layer of the dielectric substrate 12.

A reflector pattern 20 is disposed so as to be positioned slightly further inside than the dipole antennas 14 and positioned slightly further outside than the baluns 16. The reflector pattern 20 is formed of a linear conductor pattern that is disposed along the outer peripheral line of a rectangular shape slightly smaller than the dielectric substrate 12. The reflector pattern 20 is cut at positions that cross the feeders 15 so as to be insulated from the feeders 15. The gap between each of the dipole antennas 14 and the reflector pattern 20 is equal to one fourth of the effective wavelength of radio waves at the operating frequency of the dipole antennas 14. The reflector pattern 20 is connected to, at a plurality of connection points 22 arranged along the reflector pattern 20, a ground layer of the inner layer.

The plurality of patch antennas 18 are arranged in a matrix so as to be positioned further inside than the dipole antennas 14. In the example illustrated in FIG. 1A, the conductor patterns 18 are arranged in a matrix having two rows and three columns. The row direction and the column direction are parallel to the outer peripheral line of the dielectric substrate 12.

Each of the dipole antennas 14 operates as an end-fire antenna having directivity in a direction parallel to a surface of the dielectric substrate 12. Each of the patch antennas 18 has directivity in a direction normal to the surface of the dielectric substrate 12 (boresight direction). As a result of each of the plurality of dipole antennas 14 and each of the plurality of patch antennas 18 operating as two-dimensional phased array antennas, a direction of a main lobe of a radiation pattern can be changed to the azimuth direction and an elevation-angle direction.

FIG. 1B is a bottom view of the antenna module 10. A sealing-resin layer 25 is in close contact with the bottom surface of the dielectric substrate 12 (FIG. 1A). The outer periphery of the sealing-resin layer 25 is positioned slightly further inside than the outer periphery of the dielectric substrate 12. A step 40 is formed between the outer periphery of the dielectric substrate 12 and the outer periphery of the sealing-resin layer 25. A high-frequency semiconductor device (high-frequency integrated circuit element) 27, high-frequency circuit components 28, and conductor columns 30 are embedded in the sealing-resin layer 25. The high-frequency semiconductor device 27 supplies high-frequency signals to the dipole antennas 14 and the patch antennas 18 (FIG. 1A). The high-frequency circuit components 28 include an inductor, a capacitor, and the like. The high-frequency semiconductor device 27 and the high-frequency circuit components 28 are mounted on the bottom surface of the dielectric substrate 12 (FIG. 1A).

The conductor columns 30 project from the rear surface of the dielectric substrate 12, and an end of each of the conductor columns 30 is exposed at a surface of the sealing-resin layer 25. The conductor columns 30 are made of, for example, a conductive material such as copper. The sealing-resin layer 25 is made of, for example, a thermosetting resin, such as an epoxy resin or a cyanate resin. The sealing-resin layer 25 defines a mounting surface that faces a mounting substrate when the antenna module 10 is mounted on the mounting substrate.

The plurality of conductor columns 30 are arranged so as to be equally spaced along the reflector pattern 20 (FIG. 1A) when viewed in plan view. In other words, the conductor columns 30 are positioned further inside than the dipole antennas 14. The conductor columns 30 include a plurality of signal conductor columns and a plurality of ground conductor columns. Each of the signal conductor columns is connected to the high-frequency semiconductor device 27 by a wiring pattern formed on the dielectric substrate 12 (FIG. 1A). Each of the ground conductor columns is connected to the ground layer of the dielectric substrate 12 (FIG. 1A) and the reflector pattern 20. The ground conductor columns serve as reflectors of the dipole antennas 14 together with the reflector pattern 20.

FIG. 2A is a side view of the antenna module 10. The antenna module 10 includes the dielectric substrate 12 and the sealing-resin layer 25. The bottom surface of the dielectric substrate 12 is coated with the sealing-resin layer 25. The sealing-resin layer 25 defines a mounting surface 250 that faces the mounting substrate.

The step 40 is formed in the side surface of a composite structure formed of the dielectric substrate 12 and the sealing-resin layer 25. A side surface 42 extending from the mounting surface 250 to the step 40 is more recessed than a side surface 44 that is located above the step 40. As an example, the step 40 is positioned at an interface between the dielectric substrate 12 and the sealing-resin layer 25. The surface roughness of the side surface 42 extending from the mounting surface 250 to the step 40 is larger than the surface roughness of the side surface 44 located above the step 40. Note that the step 40 is not necessarily positioned at the interface between the dielectric substrate 12 and the sealing-resin layer 25. The step 40 may be positioned within the dielectric substrate 12 or may be positioned within the sealing-resin layer 25.

FIG. 2B is a cross-sectional view taken along one-dot chain line 2B-2B of FIG. 1A. The dipole antennas 14 are disposed on the uppermost semiconductor layer of the dielectric substrate 12. A ground layer 32 and transmission lines 34 are disposed on the inner layer. Each of the transmission lines 34 connects a corresponding one of the dipole antennas 14 and the high-frequency semiconductor device 27 to each other. The ground layer 32 is connected to some of the conductor columns 30 (ground conductor columns). The step 40 is disposed so as to be closer to the mounting surface 250 than the dipole antennas 14 are.

The conductor columns 30 project from the bottom surface of the dielectric substrate 12. The high-frequency semiconductor device 27, the high-frequency circuit components 28, and the conductor columns 30 are embedded in the sealing-resin layer 25. An end of each of the conductor columns 30 is exposed at the mounting surface 250. Since the high-frequency semiconductor device 27 and high-frequency circuit components 28 are embedded in the sealing-resin layer 25, the fixing strength of the high-frequency semiconductor device 27 and the high-frequency circuit components 28 with respect to the dielectric substrate 12 can be improved. In addition, the heat-dissipation characteristic of the high-frequency semiconductor device 27 can be improved. Furthermore, the mechanical strength of each of the conductor columns 30 can be improved.

A method of dividing a substrate, which has not been cut by using a dicing machine, into individual antenna modules 10 by cutting the substrate by using a dicing machine will now be described with reference to FIG. 3A to FIG. 3C.

FIG. 3A illustrates a cross-sectional view of the dielectric substrate 12 and the sealing-resin layer 25 before a dicing process is performed. The dielectric substrate 12 and the sealing-resin layer 25 include a plurality of antenna modules 10.

As illustrated in FIG. 3B, the sealing-resin layer 25 is cut along boundary lines between the antenna modules 10 by using a first dicing blade 50. As a result of the dicing process being performed, dicing grooves 51 are formed.

As illustrated in FIG. 3C, the dielectric substrate 12 is cut along the dicing grooves 51 by using a second dicing blade 52. As a result of the dicing process being performed, the dielectric substrate 12 and the sealing-resin layer 25, which include the antenna modules 10, are divided into the individual antenna modules 10.

The second dicing blade 52 has a thickness smaller than that of the first dicing blade 50. Accordingly, the step 40 is formed in the side surface of each of the antenna modules 10. In addition, the grain diameter of the first dicing blade 50 is larger than the grain diameter of the second dicing blade 52. Accordingly, the surface roughness of the side surface 42 extending from the mounting surface 250 to the step 40 is larger than the surface roughness of the side surface 44, which is located above the step 40.

A method of mounting the antenna module 10 on a mounting substrate 60 will now be described with reference to FIG. 4.

FIG. 4 illustrates a cross-sectional view of the antenna module 10 and the mounting substrate 60. The antenna module 10 is surface-mounted on the mounting substrate 60 with solder 36. The conductor columns 30 of the antenna module 10 are each connected to a corresponding one of lands 62 of the mounting substrate 60 with the solder 36. A thermosetting binder resin 68 is applied to the periphery of the antenna module 10 by using a nozzle 66. The binder resin 68 penetrates into a gap between the antenna module 10 and the mounting substrate 60 due to the capillary action thereof.

The binder resin 68 also adheres to the side surface of the antenna module 10 as a result of spreading upward along the side surface. Since the step 40 is formed in the side surface of the antenna module 10, the upward spreading of the binder resin 68 stops at the step 40. Thus, it is less likely that the binder resin 68 will adhere to the side surface 44 located above the step 40. The binder resin 68 in a liquid state is applied and then cured by being heated.

FIG. 5A and FIG. 5B are cross-sectional views of an antenna module 100 according to a comparative example and the mounting substrate 60. No step is formed in the side surface of the antenna module 100 according to the comparative example. Since no step is formed, the upward spreading of the binder resin 68 does not stop at a position partway along the side surface. In the example illustrated in FIG. 5A, the binder resin 68 has reached the upper end of the side surface of the antenna module 100. In the example illustrated in FIG. 5B, the binder resin 68 has spread out in the lateral direction after reaching the upper end of the side surface. As a result, the binder resin 68 has adhered to a portion of the top surface of the antenna module 100.

In the comparative example illustrated in FIG. 5A and FIG. 5B, the binder resin 68 intersects radio waves radiated from the dipole antennas 14. Thus, the binder resin 68 affects the radiation characteristic of each of the dipole antennas 14.

It is difficult to keep the height of the binder resin 68, which spreads upward on the side surface of the antenna module 100, and the thickness of the binder resin 68, which coats the side surface, constant. Therefore, there will be variations in the antenna characteristics of the antenna module 100.

In the first embodiment illustrated in FIG. 4, the upward spreading of the binder resin 68 is stopped by the step 40, and thus, the height of the binder resin 68 spreading upward can be controlled so as to be constant. Thus, variations in the radiation characteristic of each of the dipole antennas 14 can be reduced. In addition, a portion of the side surface at the height at which the dipole antennas 14 are positioned is not coated with the binder resin 68. Thus, the influence of the binder resin 68 on the radiation characteristic of each of the dipole antennas 14 is reduced. As a result, desired antenna characteristics can be realized.

In addition, in the first embodiment, the surface roughness of the side surface 42 extending from the mounting surface 250 of the antenna module 10 to the step 40 is larger than the surface roughness of the side surface 44 located above the step 40. Consequently, the binder resin 68 is likely to spread upward on the side surface 42 located below the step 40, and the binder resin 68 is less likely to spread upward on the side surface 44 located above the step 40. Even if the thickness of the binder resin 68 coating the side surface 42 below the step 40 exceeds the height (height in the lateral direction) of the step 40, the upward spreading of the binder resin 68 on the side surfaces 44 located above the step 40 can be suppressed.

In the case where the height (height in the lateral direction) of the step 40 is too small, the upward spreading of the binder resin 68 cannot be stopped by the step 40 with good reproducibility. In addition, in the case where the step 40 is too low, it is necessary to perform alignment of the second dicing blade 52 and each of the dicing grooves 51 with each other with high precision when the second dicing process illustrated in FIG. 3C is performed. Considering these facts, the height of the step 40 can be set to 50 µm or more.

In the case where the step 40 is too high, the mechanical strength of the dielectric substrate 12 is reduced. In order to obtain a sufficient strength, the height of the step 40 can be set to be the thickness of the dielectric substrate 12 or less.

In the comparative example illustrated in FIG. 5B, the height from a to-be-mounted surface of the mounting substrate 60 to the top of the binder resin 68 is larger than the height from the to-be-mounted surface of the mounting substrate 60 to the top surface of the antenna module 100. There is a case where the binder resin 68 that adheres to the top surface of the antenna module 100 becomes a hindrance in the assembly of a device. In the first embodiment, since it is less likely that the binder resin 68 will be applied to the top surface of the antenna module 10, the binder resin 68 will not become a hindrance in the assembling.

In addition, in the first embodiment, the binder resin 68 is brought into close contact not only with the side surface 42, which is located below the step 40, but also with the step 40, which faces toward the mounting substrate 60. Thus, a decrease in the fixing strength due to the binder resin 68 being stopped spreading upward at a position partway along the side surface is suppressed.

Second Embodiment

The antenna module 10 according to a second embodiment will now be described with reference to FIG. 6A and FIG. 6B. The difference between the antenna module 10 according to the second embodiment and the antenna module 10 according to the first embodiment, which is illustrated in FIG. 1 to FIG. 4, will be described below, and the description of the configuration common to the second embodiment and the first embodiment will be omitted. In the first embodiment, the antenna module 10 is mounted on the mounting substrate 60 by using the solder 36 (FIG. 4). In the second embodiment, a non-conductive paste (NCP) method is employed.

FIG. 6A is a cross-sectional view of the antenna module 10 that has not been mounted on the mounting substrate 60 and the mounting substrate 60. For example, metal bumps 37 are formed at ends of the conductor columns 30. An insulating paste 70 is applied to a mounting region of the to-be-mounted surface of the mounting substrate 60 in which the antenna module 10 is to be mounted. The insulating paste 70 covers the lands 62, which are formed on the mounting substrate 60.

As illustrated in FIG. 6B, the antenna module 10 is disposed on the mounting substrate 60 and pressurized. The metal bumps 37 are electrically connected to the lands 62 as a result of being pressed against the lands 62. At the same time, the insulating paste 70 is pushed out from the gap between the antenna module 10 and the mounting substrate 60. The insulating paste 70, which is pushed out, coats the side surface of the antenna module 10 as a result of spreading upward. The insulating paste 70 is cured by heating the antenna module 10 after pressure has been applied to the antenna module 10. As in the case of the first embodiment, in the second embodiment, the upward spreading is stopped by the step 40. Therefore, advantageous effects similar to those of the first embodiment can be obtained.

Instead of the insulating paste 70, an anisotropic conductive paste (ACP) may be used. In the case of using an anisotropic conductive paste, the conductor columns 30 of the antenna module 10 and the lands 62 of the mounting substrate 60 are electrically connected to each other by the anisotropic conductive paste. Consequently, the metal bumps 37 are not necessary.

Third Embodiment

An antenna module according to a third embodiment will now be described with reference to FIG. 7A and FIG. 7B. The difference between the antenna module according to the third embodiment and the antenna module 10 according to the first embodiment, which is illustrated in FIG. 1 to FIG. 4, will be described below, and the description of the configuration common to the third embodiment and the first embodiment will be omitted. In the third embodiment, instead of the sealing-resin layer 25 (FIG. 2A and FIG. 2B) according to the first embodiment, a frame-shaped substrate 26 is used.

Figure 7B:
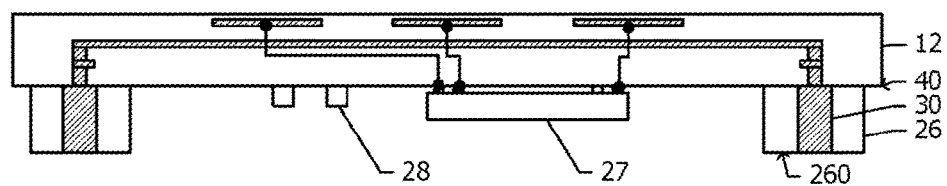
FIG. 7B is a cross-sectional view taken along one-dot chain line 7B-7B of FIG. 7A.

FIG. 7A is a bottom view of the antenna module 10 according to the third embodiment. FIG. 7B is a cross-sectional view taken along one-dot chain line 7B-7B of FIG. 7A. The frame-shaped substrate 26 is bonded to the bottom surface of the dielectric substrate 12. The high-frequency semiconductor device 27 and the high-frequency circuit components 28 are mounted in a region surrounded by the frame-shaped substrate 26. The outer periphery of the frame-shaped substrate 26 is positioned slightly further inside than the outer periphery of the dielectric substrate 12. Therefore, as in the case of the first embodiment, the step 40 is formed. The conductor columns 30 are embedded in through holes that are formed in the frame-shaped substrate 26. The frame-shaped substrate 26 defines a mounting surface 260.

As in the first embodiment and the second embodiment, as a result of the conductor columns 30 being embedded in a dielectric member, such as the sealing-resin layer 25 (FIG. 2A and FIG. 2B) or the frame-shaped substrate 26, the mechanical strength of each of the conductor columns 30 can be improved. Also in the third embodiment, the step 40 is formed in the side surface of the antenna module 10. Therefore, advantageous effects similar to those of the first embodiment can be obtained.

Fourth Embodiment

A circuit module 80 according to a fourth embodiment will now be described with reference to FIG. 8A. The difference between the circuit module 80 according to the fourth embodiment and the antenna module 10 according to the first embodiment, which is illustrated in FIG. 1 to FIG. 4, will be described below, and the description of the configuration common to the fourth embodiment and the first embodiment will be omitted. In the fourth embodiment, the circuit module 80 is not provided with an antenna.

Figure 8A:
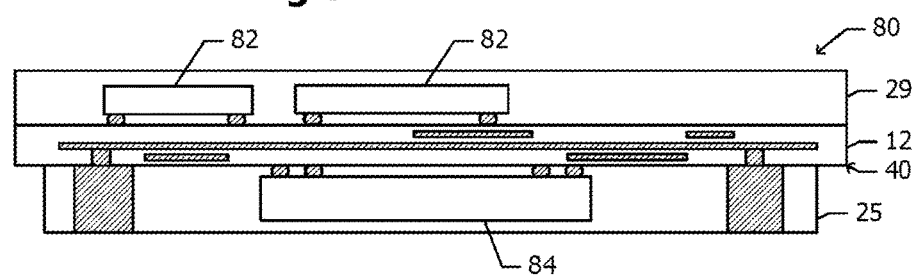
FIG. 8A is a cross-sectional view of a circuit module according to a forth embodiment.

FIG. 8A is a cross-sectional view of the circuit module 80 according to the forth embodiment. Semiconductor devices 82 are mounted on the top surface of the dielectric substrate 12, and a semiconductor device 84 is mounted on the bottom surface of the dielectric substrate 12. As in the case of the first embodiment, the bottom surface of the dielectric substrate 12 is coated with the sealing-resin layer 25. The semiconductor device 84 is embedded in the sealing-resin layer 25. The top surface of the dielectric substrate 12 is coated with another sealing-resin layer 29. The semiconductor devices 82 are embedded in the sealing-resin layer 29.

The step 40 is formed in the side surface of a composite structure formed of the dielectric substrate 12, the lower sealing-resin layer 25, and the upper sealing-resin layer 29. In the example illustrated in FIG. 8A, the step 40 is formed at an interface between the dielectric substrate 12 and the lower sealing-resin layer 25.

Also in the fourth embodiment, the step 40 stops upward spreading of the binder resin 68 (FIG. 4). Therefore, adhesion of the binder resin 68 to the top surface of the circuit module 80 can be suppressed. As a result of the binder resin 68 adhering to a surface of the step 40, the surface facing downward, sufficient contact strength between the circuit module 80 and the mounting substrate 60 can be ensured.

Figure 8B:
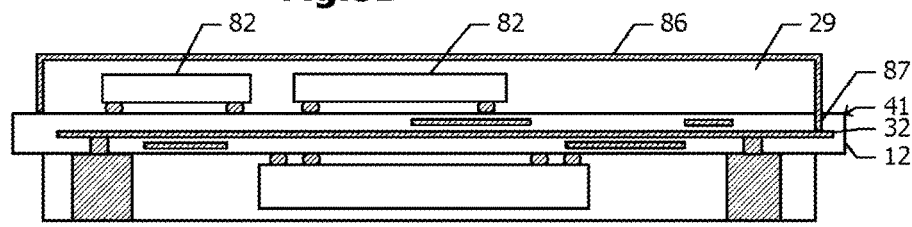
FIG. 8B is a cross-sectional view of a circuit module according to a modification of the fourth embodiment.

FIG. 8B is a cross-sectional view of the circuit module 80 according to a modification of the fourth embodiment. In the present modification, the side surface of the upper sealing-resin layer 29 is more recessed than the side surface of the dielectric substrate 12. Thus, a step 41 facing upward is formed at an interface between the dielectric substrate 12 and the sealing-resin layer 29. The top surface and the side surface of the sealing-resin layer 29 are coated with a shield layer 86 that is made of a conductive material.

A groove 87 is formed in a region of the top surface of the dielectric substrate 12 in which the step 41 is formed. The ground layer 32 is exposed at the bottom surface of the groove 87. The shield layer 86 is connected to the ground layer 32 by the groove 87. In the present modification, in addition to the advantageous effects of the fourth embodiment, which is illustrated in FIG. 8A, the semiconductor devices 82 can be electromagnetically shielded.

The above-described embodiments are examples, and it is obvious that the configurations according to the different embodiments may be partially replaced with one another or may be combined with each other. Similar advantageous effects obtained in similar configurations of the plurality of embodiments will not be described in every embodiment. In addition, the present invention is not limited to the above-described embodiments. For example, it is obvious to those skilled in the art that various changes, improvements, and combinations may be made to the present invention.

REFERENCE SIGNS LIST 10 antenna module
12 dielectric substrate
14 dipole antenna
15 feeder
16 balun (balanced-to-unbalanced transformer)
17 connection point
18 patch antenna
20 reflector pattern
22 connection point
25 sealing-resin layer
26 frame-shaped substrate
27 high-frequency semiconductor device
28 high-frequency circuit component
29 sealing-resin layer
30 conductor column
32 ground layer
34 transmission line
36 solder
37 metal bump
40, 41 step
42 side surface extending from mounting surface to step
44 side surface located above step
50 first dicing blade
51 dicing groove
52 second dicing blade
60 mounting substrate
62 land
66 nozzle
68 binder resin
70 insulating paste
80 circuit module
82, 84 semiconductor device
86 shield layer
87 groove
100 antenna module
250, 260 mounting surface

The invention claimed is:

1. An antenna module comprising:
a dielectric substrate in which an antenna being disposed, the antenna comprising a conductor pattern;
a high-frequency semiconductor device that is mounted on a bottom surface of the dielectric substrate and that supplies a high-frequency signal to the antenna;
a plurality of conductor columns that projects from the bottom surface; and
a dielectric member that is disposed on the bottom surface and in which the conductor columns are embedded such that an end of each of the conductor columns projects out from the dielectric member,
wherein the dielectric member defines a mounting surface that faces a mounting substrate, and
wherein a step is formed in a side surface of a composite structure that includes the dielectric substrate and the dielectric member, said step being formed between an outer periphery of the dielectric substrate and an outer periphery of the dielectric member, and a part of the side surface extending from the mounting surface to the step is more recessed than other part of the side surface that is located above the step.

2. The antenna module according to claim 1,
wherein the antenna has directivity in a direction parallel to a substrate surface of the dielectric substrate, and the step is disposed so as to be closer to the mounting surface than the antenna is.

3. The antenna module according to claim 2,
wherein a surface roughness of the part of the side surface extending from the mounting surface to the step is larger than a surface roughness of the other part of the side surface located above the step.

4. The antenna module according to claim 2,
wherein the high-frequency semiconductor device is embedded in the dielectric member.

5. The antenna module according to claim 1,
wherein a surface roughness of the part of the side surface extending from the mounting surface to the step is larger than a surface roughness of the other part of the side surface located above the step.

6. The antenna module according to claim 5,
wherein the high-frequency semiconductor device is embedded in the dielectric member.

7. The antenna module according to claim 1,
wherein the high-frequency semiconductor device is embedded in the dielectric member.

8. A circuit module comprising:
a dielectric substrate on which a conductor pattern is provided;
a first semiconductor device that is mounted on a bottom surface of the dielectric substrate and connected to the conductor pattern;
a plurality of conductor columns that projects from the bottom surface; and
a dielectric member that is disposed on the bottom surface and in which the conductor columns are embedded such that an end of each of the conductor columns projects out from the dielectric member,
wherein the dielectric member defines a mounting surface that faces a mounting substrate, and
wherein a step is formed in a side surface of a composite structure that includes the dielectric substrate and the dielectric member, said step being formed between an outer periphery of the dielectric substrate and an outer periphery of the dielectric member, and a portion of the side surface extending from the mounting surface to the step is more recessed than other portion of the side surface that is located above the step.

9. The circuit module according to claim 8,
wherein the portion of the side surface extending from the mounting surface to the step has a roughness larger than a roughness of the other portion of the side surface that is located above the step.

10. The circuit module according to claim 9, further comprising:
a second semiconductor device that is mounted on a top surface of the dielectric substrate;
a sealing-resin layer that coats the top surface and in which the second semiconductor device is embedded, the sealing-resin layer having a side surface, which is more recessed than a side surface of the dielectric substrate; and
a shield layer that coats the sealing-resin layer and that is connected to a ground layer, which is provided on the dielectric substrate, at a position further outside than the side surface of the sealing-resin layer is.

11. The circuit module according to claim 8, further comprising:

a second semiconductor device that is mounted on a top surface of the dielectric substrate;

a sealing-resin layer that coats the top surface and in which the second semiconductor device is embedded, the sealing-resin layer having a side surface, which is more recessed than a side surface of the dielectric substrate; and a shield layer that coats the sealing-resin layer and that is connected to a ground layer, which is provided on the dielectric substrate, at a position further outside than the side surface of the sealing-resin layer is.

12. The circuit module according to claim 11, wherein the shield layer contacts the sealing-resin layer.

13. The circuit module according to claim 10, wherein the shield layer contacts the sealing-resin layer.

* * * * *